(12) United States Patent
Zhang et al.

(10) Patent No.: US 7,875,348 B2
(45) Date of Patent: *Jan. 25, 2011

(54) MOLECULAR LAYER AND METHOD OF FORMING THE SAME

(75) Inventors: Sean X. Zhang, Cupertino, CA (US); Yong Chen, Sherman Oaks, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 401 days.

This patent is subject to a terminal disclaimer.

(21) Appl. No.: 11/773,090

(22) Filed: Jul. 3, 2007

(65) Prior Publication Data

US 2007/0264516 A1 Nov. 15, 2007

Related U.S. Application Data

(62) Division of application No. 10/881,150, filed on Jun. 30, 2004, now Pat. No. 7,255,892.

(51) Int. Cl.
B32B 9/04 (2006.01)
B32B 27/06 (2006.01)
(52) U.S. Cl. ............... 428/332; 428/523; 428/411.1
(58) Field of Classification Search ............... None
See application file for complete search history.

(56) References Cited

U.S. PATENT DOCUMENTS

| | | | |
|---|---|---|---|
| 5,556,528 A | 9/1996 | Bohn et al. | |
| 6,124,963 A | 9/2000 | Schumaker | |
| 6,128,214 A | 10/2000 | Kuekes et al. | |
| 6,284,197 B1 * | 9/2001 | Abbott et al. | ............ 422/82.05 |
| 6,459,095 B1 | 10/2002 | Heath et al. | |
| 6,674,932 B1 | 1/2004 | Zhang et al. | |
| 7,255,892 B2 * | 8/2007 | Zhang et al. | .................. 427/58 |
| 2002/0164419 A1 | 11/2002 | Fukushima et al. | |
| 2002/0176276 A1 | 11/2002 | Zhang et al. | |

FOREIGN PATENT DOCUMENTS

EP 0330395 8/1989

OTHER PUBLICATIONS

Blinov, L.M., "Langmuir-Films", Soviet Physics Uspekhi, American Institute of Physics, New York, US vol. 31, No. 7, Jul. 1, 1988, pp. 623-641.

* cited by examiner

*Primary Examiner*—Monique R Jackson (57) ABSTRACT

A molecular layer includes a Langmuir-Blodgett (LB) film of a molecule connected to a plurality of active device molecules, the molecule having a moiety with first and second connecting groups at opposed ends of the moiety. Each of the plurality of active device molecules includes a switching moiety, a self-assembling connecting group at one end of the switching moiety, and a linking group at an opposed end of the moiety. One or more defect site(s) exist between the plurality of active device molecules. A respective number of the first connecting groups of the LB film are connected to the plurality of active device molecules via at least some of the linking groups such that the LB film covers the plurality of active device molecules and the one or more defect site(s).

20 Claims, 4 Drawing Sheets

MOLECULAR LAYER AND METHOD OF FORMING THE SAME

CROSS REFERENCE TO RELATED APPLICATION

This application is a divisional of currently U.S. patent application Ser. No. 10/881,150, filed Jun. 30, 2004, now U.S. Pat. No. 7,255,892 which is incorporated herein by reference in its entirety.

BACKGROUND

The present invention relates generally to molecular electronics, and more particularly to a molecular layer formed by Langmuir-Blodgett (LB) and self-assembling monolayer (SAM) methods.

Molecular devices comprising two electrodes (for example, a bottom electrode and a top electrode) and a molecular switching layer or film at the junction of the two electrodes are known. Such devices may be useful, for example, in the fabrication of devices based on electrical switching, such as molecular wire crossbar interconnects for signal routing and communications, molecular wire crossbar memory, molecular wire crossbar logic employing programmable logic arrays, multiplexers or demultiplexers for molecular wire crossbar networks, molecular wire transistors, and the like. Such devices may further be useful, for example, in the fabrication of devices based on optical switching, such as displays, electronic books, rewritable media, electrically tunable optical lenses, electrically controlled tinting for windows and mirrors, optical crossbar switches (for example, for routing signals from one of many incoming channels to one of many outgoing channels), and the like.

Typically, the molecular switching layer or film comprises an organic molecule that, in the presence of an electrical (E) field, switches between two or more energetic states, such as by an electrochemical oxidation or reduction (redox) reaction or by a change in the band gap of the molecule induced by the applied E-field.

It is important to form a good electrical contact between the electrode and the molecular switching layer in order to fabricate operative molecular devices. Molecules with special chemical end groups are able to form direct chemical bonds with metal or semiconductor electrodes to form a self-assembled monolayer (SAM), which may have a good electrical contact with an electrode(s). However, this self-assembled molecular layer formed on the surface of the electrode may generally be prone to a high density of defects. If a second electrode is formed on the molecular layer, then an electrical short may occur between the first and second electrode through the defects in the self-assembled molecular layer.

The formation of Langmuir-Blodgett (LB) layers or films employing switching molecules has been attempted because such layers or films are generally much denser than SAM films. Further, LB layers or films have relatively low defect densities compared to SAM films. However, it has proven to be a significant challenge to effectively bond LB films to the electrode substrate. As such, if the LB film is not sufficiently bonded to the electrode(s), then poor electrical contact may result.

As such, there is a need for providing a high density molecular switching layer on an electrode(s), which layer also bonds well with the electrode. Further, there is a need for reducing or substantially eliminating the electrical short circuit problems potentially associated with molecular electronic devices.

SUMMARY

The present invention substantially solves the drawbacks enumerated above by providing a molecular layer including a Langmuir-Blodgett (LB) film of a molecule connected to a plurality of active device molecules. The molecule has a moiety with first and second connecting groups at opposed ends of the moiety. Each of the plurality of active device molecules includes a switching moiety, a self-assembling connecting group at one end of the switching moiety, and a linking group at an opposed end of the moiety. One or more defect site(s) exist between the plurality of active device molecules. A respective number of the first connecting groups of the LB film are connected to at least some of the plurality of active device molecules via the linking groups such that the LB film covers the plurality of active device molecules and the one or more defect site(s).

BRIEF DESCRIPTION OF THE DRAWINGS

Objects, features and advantages will become apparent by reference to the following detailed description and drawings, in which like reference numerals correspond to similar, though not necessarily identical components. For the sake of brevity, reference numerals having a previously described function may not necessarily be described in connection with subsequent drawings in which they appear.

DETAILED DESCRIPTION

Embodiments of the present invention advantageously use a novel concept of providing a molecular layer, which may act as a protective layer. This novel concept takes advantage of the advantageous qualities of self-assembly techniques (SAM) (e.g. good electrical contact due to chemical bonding) and Langmuir-Blodgett (LB) deposition (e.g. low defect density). The concept further substantially eliminates problems that may in some instances be associated with these techniques.

The method according to embodiments of the present invention provides orienting an LB film that may be dense and highly uniform on a molecular film such that the LB film acts as a barrier between the molecular film and any subsequently deposited metal.

Figure 1A:
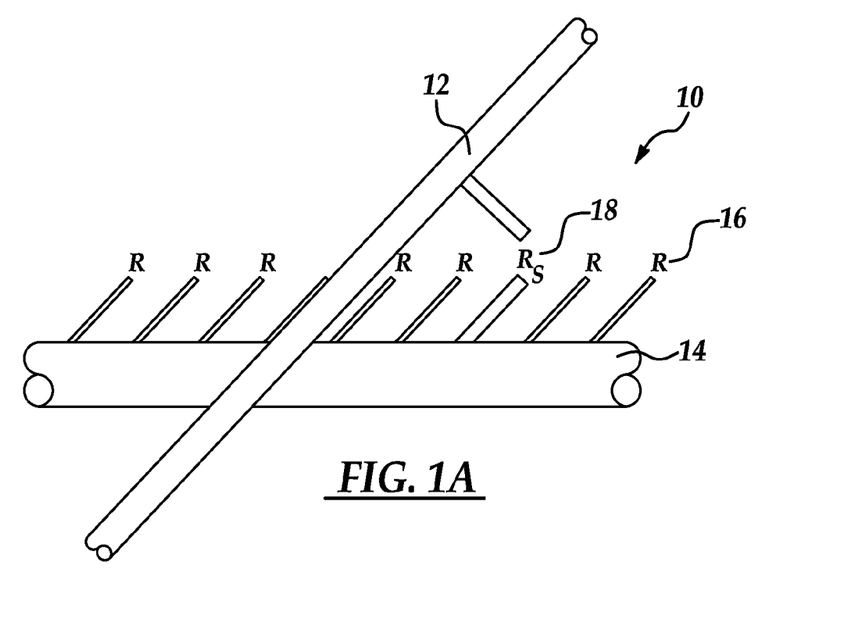
FIG. 1A is a schematic representation of two crossed wires, with at least one molecule at the intersection of the two wires.
Figure 1B:
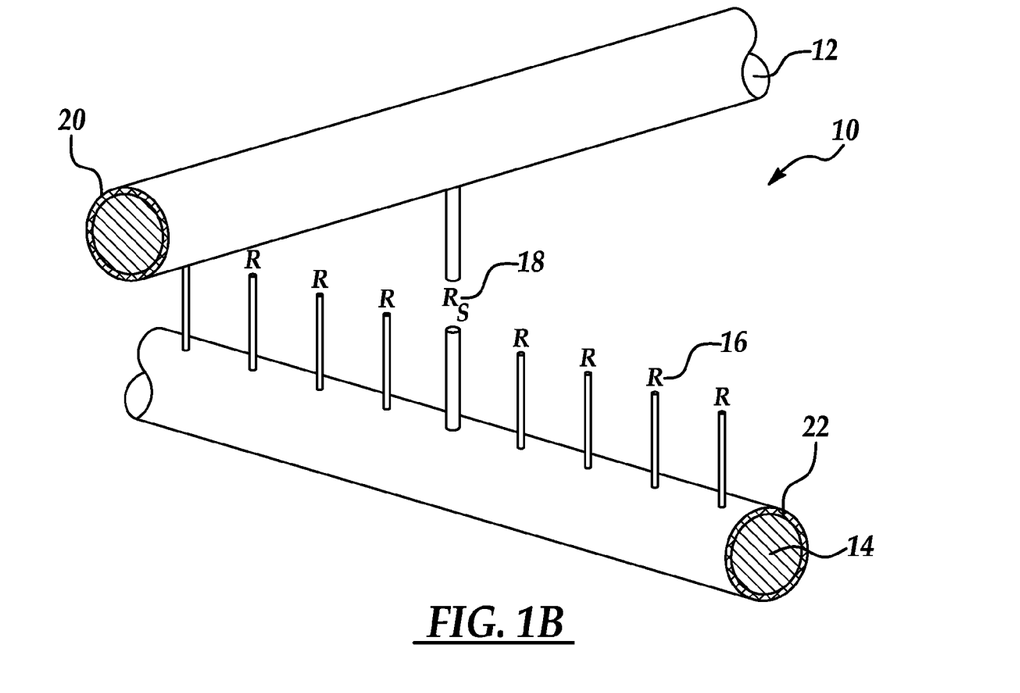
FIG. 1B is a perspective elevational view, depicting the crossed-wire device shown in FIG. 1A.

Referring now to FIGS. 1A-1B, a crossed wire switching device 10 includes two wires 12, 14, each either a metal and/or semiconductor wire, that are crossed at some substantially non-zero angle. Disposed between wires 12, 14 is a layer 16 of molecules or molecular compounds, denoted R. The particular molecules (active device molecules) 18 that are sandwiched at the intersection (also interchangeably referred to herein as a junction) of the two wires 12, 14 are identified as switch molecules $R_S$.

There are generally two primary methods of operating such switches 10, depending on the nature of the switch molecules 18. The molecular switching layer 16 includes a switch molecule 18 (for example, an organic molecule) that, in the presence of an electrical (E) field, switches between two or more energetic states, such as by an electrochemical oxidation or reduction (redox) reaction or by a change in the band gap of the molecule induced by the applied E-field.

In the former case, when an appropriate voltage is applied across the wires 12, 14, the switch molecules $R_S$ are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) would be oxidized. In another example, a molecule is reduced, and one of the wires 12, 14 is oxidized. In a third example, a molecule is oxidized, and one of the wires 12, 14 is reduced. In a fourth example, one wire 12, 14 is oxidized, and an oxide associated with the other wire 14, 12 is reduced. In such cases, oxidation or reduction may affect the tunneling distance or the tunneling barrier height between the two wires, thereby exponentially altering the rate of charge transport across the wire junction, and serving as the basis for a switch. Examples of molecules 18 that exhibit such redox behavior include rotaxanes, pseudo-rotaxanes, and catenanes; see, e.g., U.S. Pat. No. 6,459,095, entitled "Chemically Synthesized and Assembled Electronic Devices", issued Oct. 1, 2002, to James R. Heath et al, the disclosure of which is incorporated herein by reference in its entirety.

Further, the wires 12, 14 may be modulation-doped by coating their surfaces with appropriate molecules—either electron-withdrawing groups (Lewis acids, such as boron trifluoride ($BF_3$)) or electron-donating groups (Lewis bases, such as alkylamines) to make them p-type or n-type conductors, respectively. FIG. 1B depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_S$ 18 is formed. Or yet alternatively, the wires 12, 14 may be coated with molecular species 20, 22, respectively, for example, that enable one or both wires 12, 14 to be suspended to form colloidal suspensions, as discussed below. Details of such coatings are provided in above-referenced U.S. Pat. No. 6,459,095.

In the latter case, examples of molecule 18 based on field induced changes include E-field induced band gap changes, such as disclosed and claimed in patent application Ser. No. 9/823,195, filed Mar. 29, 2001, published as Publication No. 2002/0176276 on Nov. 28, 2002, which application is incorporated herein by reference in its entirety. Examples of molecules used in the E-field induced band gap change approach include molecules that evidence molecular conformation change or an isomerization; change of extended conjugation via chemical bonding change to change the band gap; or molecular folding or stretching.

Changing of extended conjugation via chemical bonding change to change the band gap may be accomplished in one of the following ways: charge separation or recombination accompanied by increasing or decreasing band localization; or change of extended conjugation via charge separation or recombination and π-bond breaking or formation.

The formation of micrometer scale and nanometer scale crossed wire switches 10 uses either a reduction-oxidation (redox) reaction to form an electrochemical cell or uses E-field induced band gap changes to form molecular switches. In either case, the molecular switches typically have two states, and may be either irreversibly switched from a first state to a second state or reversibly switched from a first state to a second state. In the latter case, there are two possible conditions: either the electric field may be removed after switching into a given state, and the molecule will remain in that state ("latched") until a reverse field is applied to switch the molecule back to its previous state; or removal of the electric field causes the molecule to revert to its previous state, and hence the field must be maintained in order to keep the molecule in the switched state until it is desired to switch the molecule to its previous state.

Color switch molecular analogs, particularly based on E-field induced band gap changes, are also known; see, e.g., U.S. application Ser. No. 9/844,862, filed Apr. 27, 2001.

Figure 2:
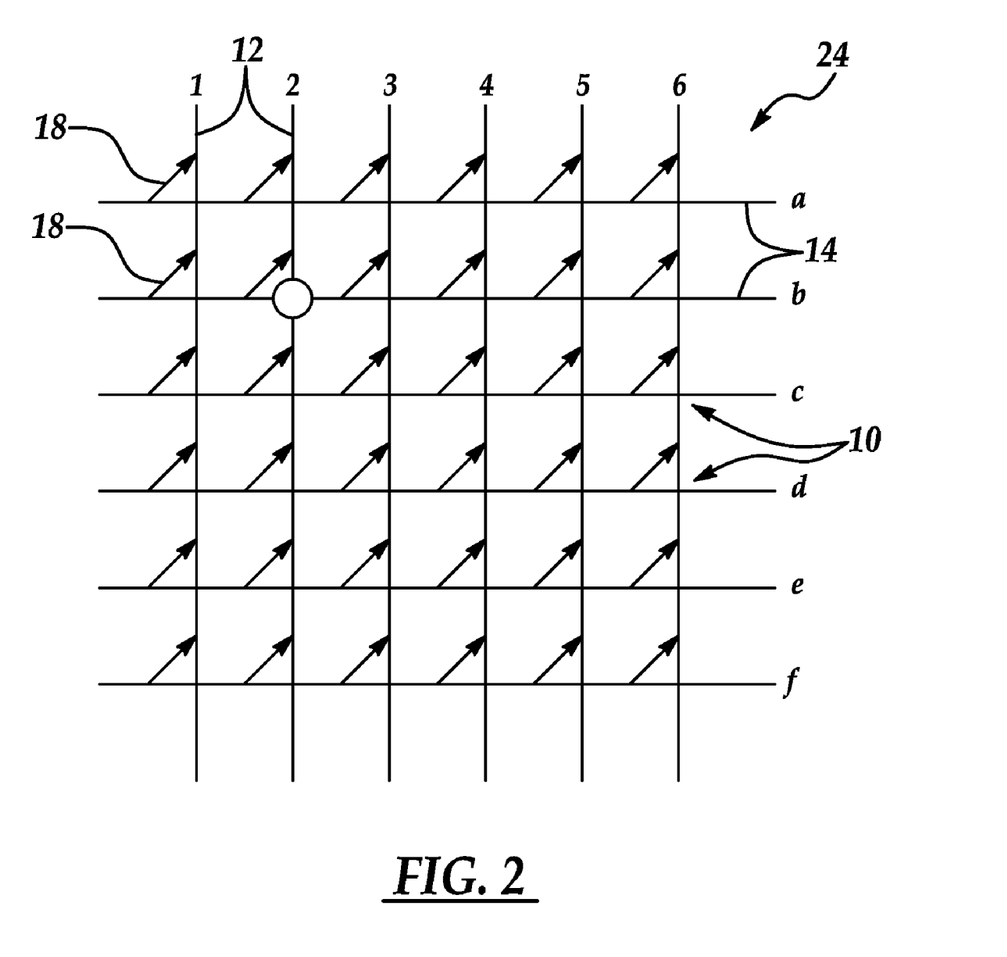
FIG. 2 is a schematic representation of a two-dimensional array of switches, depicting a 6×6 crossbar switch.

Referring now to FIG. 2, the switch 10 may be replicated in a two-dimensional array to form a plurality or array 24 of switches 10 to form a crossbar switch. FIG. 2 depicts a 6×6 array 24. However, it is to be understood that the embodiments herein are not to be limited to the particular number of elements, or switches 10, in the array 24. Access to a single point, e.g., 2b, is done by impressing voltage on wires 2 and b to cause a change in the state of the molecular species 18 at the junction thereof, as described above. Thus, access to each junction is readily available for configuring those that are pre-selected. Details of the operation of the crossbar switch array 24 are further discussed in U.S. Pat. No. 6,128,214, entitled "Molecular Wire Crossbar Memory", issued on Oct. 3, 2000, to Philip J. Kuekes et al., which is incorporated herein by reference in its entirety.

An embodiment of the molecular layer 21 (depicted in FIGS. 3E & 3G) includes a Langmuir-Blodgett (LB) film of a molecule connected to a plurality of active device molecules. The molecule includes a molecular switching moiety having first and second connecting groups at opposed ends of the moiety while each of the plurality of active device molecules includes a switching moiety, a self-assembling connecting group at one end of the switching moiety, and a linking group at an opposed end of the switching moiety. The molecular layer 21 also has at least one defect site between the plurality of active device molecules. A respective number of the first connecting groups of the LB film are connected to the plurality of active device molecules via the linking groups such that the LB film covers the plurality of active device molecules and the at least one defect site.

Referring now to FIGS. 3A through 3G, a method of forming a molecular layer 21 according to an embodiment is as follows.

Figures 3A, 3B:
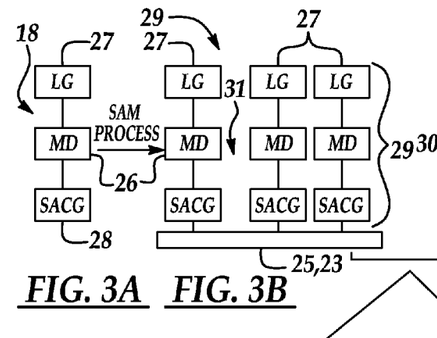
FIGS. 3A-3G is a schematic flow diagram depicting an embodiment of a method of forming a molecular layer between two electrodes.
Figures 3C, 3D:
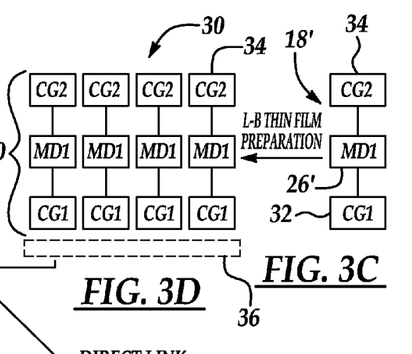

Generally, FIGS. 3A through 3D depict the formation of both a self-assembled molecular film 29 (FIGS. 3A and 3B) and an LB film 30 (FIGS. 3C and 3D). The self assembled molecular film 29 is formed from a plurality of active device molecules 18 connected to a substrate 25, the active device molecules 18 each having a molecular switching moiety (MD) 26 with a linking group (LG) 27 and a self assembled connecting group (SACG) 28 attached at opposed ends of the moiety (MD) 26. The self assembled molecular film 29 also has at least one defect site 31 therein (as seen in FIG. 3B).

The LB film 30 is made from a plurality of molecules 18' formed on an interface 36 between an organic solvent(s)/air and water, each of the molecules 18' having a molecular switching moiety (MD1) 26' with first and second connecting groups (CG1) 32, (CG2) 34 attached at opposed ends of the moiety (MD1) 26'. In an alternate embodiment, moiety (MD1) 26' is not a switching moiety; in this embodiment, the LB film 30 mainly serves as a protective layer for the SAM film 29, for example by serving as an insulating portion to substantially aid in preventing electrical shorting, metal penetration, undesirable chemical reactions, or the like.

More specifically, FIGS. 3A and 3B depict active device molecule(s) 18 chemically bonded to a surface of the substrate 25 to form a self-assembled molecular film 29. Chemically bonding the active device molecules 18 to the substrate 25 may be accomplished by a self-assembled mono-layer (SAM) process. Using this process, self-assembling connecting groups (SACG) 28 of the active device molecules 18 bond to the substrate 25 surface.

It is to be understood that the substrate 25 may be made of any suitable conductive or semi-conductive material. In an embodiment, the substrate 25 is a bottom electrode 23 made of noble metals (e.g. Au, Pt, Ag, Cu, alloys of these metals, or the like). It is to be understood that in an optical application, the substrate 25 may be a non-electrode material or a transparent electrode, such as indium tin oxide (ITO).

In an embodiment, the active device molecule 18 includes a switching moiety (MD) 26 having a linking group (LG) 27 and the previously mentioned self-assembling connecting group (SACG) 28 at opposed ends thereof.

The molecular switching moiety (MD) 26, (MD1) 26' is an optically switchable molecular functional unit and/or an electrically switchable molecular functional unit. It is to be understood that the switching moiety (MD) 26, (MD1) 26' may be any suitable moiety, however, in an embodiment, the moiety (MD) 26, (MD1) 26' includes at least one of saturated hydrocarbons, unsaturated hydrocarbons, substituted hydrocarbons, heterocyclic systems, organometallic complex systems, or mixtures thereof.

In an embodiment, the switching moiety (MD) 26, (MD1) 26' includes a moiety that, in the presence of an electric field, undergoes oxidation or reduction, and/or experiences a band gap change. In one embodiment, the switching moiety (MD) 26, (MD1) 26' undergoes oxidation or reduction and includes at least one of rotaxanes, pseudo-rotaxanes, catenanes, and mixtures thereof. In another embodiment, the switching moiety (MD) 26, (MD1) 26' undergoes a band gap change in the presence of an external electrical field, this is described in U.S. Pat. No. 6,674,932 granted to Zhang et al. on Jan. 6, 2004, the specification of which is hereby incorporated herein by reference in its entirety.

Figure 3E:
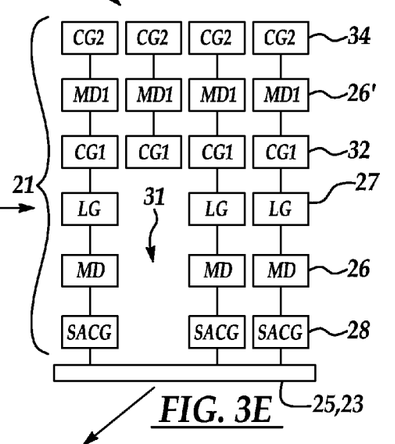

The linking group (LG) 27 may be bonded to one end of the switching moiety (MD) 26 such that it is adapted to bond to the LB film 30 (shown in FIG. 3E). It is to be understood that the linking group (LG) 27 may be, but is not limited to at least one of multivalent hetero atoms selected from the group consisting of C, N, O, S, and P; functional groups containing the hetero atoms and selected from the group consisting of $NH_2$, NH-alkyl, NH-acyl, and NH-aryl; pyridine; substituted pyridines; heterocyclic compounds including at least one nitrogen atom; carboxylic acids; derivatives thereof (non-limitative examples of which include carboxylic esters, amides, nitriles, or the like); sulfuric acids; phosphoric acids; saturated hydrocarbons; unsaturated hydrocarbons; heterocyclic systems; amines; alkyl amines; and mixtures thereof.

The self-assembling connecting group (SACG) 28 may be bonded to the opposed end of the switching moiety (MD) 26, such that it is capable of bonding to the substrate 25 surface. Examples of suitable self-assembling connecting groups (SACG) 28 include, but are not limited multivalent hetero atoms selected from the group consisting of C, N, O, S, and/or P; functional groups containing the hetero atoms and selected from the group consisting of SH, S-acyl, S—S-alkyl, OH, $NH_2$, NH-alkyl, NH-aryl, NH-acyl; heterocyclic compounds; pyridine; substituted pyridines (non-limitative examples of which include amino substituted pyridines, such as N,N-dimethylamino pyridine); carboxylic acids; derivatives thereof (non-limitative examples of which include carboxylic esters, amides, nitriles, or the like); amines; alkyl amines; or mixtures thereof.

Upon bonding the active device molecules 18 to the substrate 25 via a SAM process, the self-assembled molecular film 29 is formed. Due in part to the SAM process, the self-assembled molecular film 29 may be a loosely packed monolayer film that contains one or more defect sites 31 that may in some instances cause short circuits when electrical contacts (e.g. top electrodes) are deposited on the film 29.

Referring now to FIGS. 3C and 3D together, an aqueous environment contains a molecule 18' with a molecular switching moiety (MD1) 26' having a first connecting group (CG1) 32 and a second connecting group (CG2) 34 attached to opposed ends of the moiety (MD1) 26'.

In an embodiment, the molecule 18' is an organic molecule, and the molecular switching moiety (MD1) 26' (as previously described) is an optically switchable molecular functional unit and/or an electrically switchable molecular functional unit.

The first and second connecting groups (CG1, CG2) 32, 34 may be hydrophilic or hydrophobic, as long as at least one (CG1, CG2) 32, 34 is substantially hydrophilic while the other (CG2, CG1) 34, 32 is substantially hydrophobic. Examples of suitable connecting groups (CG1, CG2) 32, 34 include, but are not limited to multivalent hetero atoms selected from the group consisting of C, N, O, S, and P; functional groups containing the hetero atoms and SH; OH; $NH_2$; NH-alkyl; NH-aryl; NH-acyl; pyridine; saturated hydrocarbons; unsaturated hydrocarbons; heterocyclic compounds including at least one nitrogen atom; heterocyclic systems; carboxylic acids; derivatives thereof (non-limitative examples of which include carboxylic esters, amides, nitriles, or the like); amines; alkyl amines; sulfuric acids; phosphoric acids; and mixtures thereof.

While the first connecting group (CG1) 32 is adapted to bond to the linking group (LG) 27 (as described hereinbelow), it is to be understood that either the first or the second connecting group (CG1, CG2) 32, 34 may be adapted to bond to the linking group (LG) 27 of the self-assembled molecular film 29.

A Langmuir-Blodgett (LB) film 30 of the molecule 18' is formed on an interface 36 between an organic solvent(s)/air and water, the film 30 being depicted by the plurality of molecules 18' shown in FIG. 3D. The organic solvent(s) is above the water, and in some instances may volatilize quickly; as such what was an interface 36 between water and organic solvent(s) may become an interface 36 between water and air. Thus, it is to be understood that interface 36 as defined herein may be a water/solvent interface 36 and/or a water/air interface 36.

The method further includes connecting the LB film 30 to the self-assembled molecular film 29. It is contemplated that one of the first and second connecting groups (CG1, CG2) 32, 34 of the molecule 18' may be chemically or physically bonded to one or more of the linking groups (LG) 27 of the active device molecules 18 in the self-assembled molecular film 29. In an embodiment and as shown in FIGS. 3E and 3F, the first connecting group(s) (CG1) 32 is adapted to bond and does bond to at least some of the linking groups (LG) 27 of the self assembled molecular film 29.

Figure 3F:
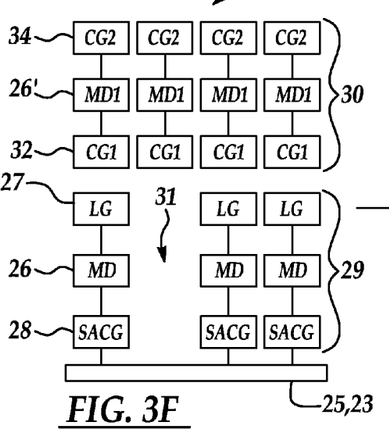

Connecting the LB film 30 to the self-assembled molecular film 29 may be accomplished by either a direct connection (FIG. 3E) or by an indirect connection (FIGS. 3E and 3F together). FIG. 3F illustrates an intermediate step where the LB film 30 is deposited on, but not connected to the self-assembled molecular film 29.

It is to be understood that the connection between the LB film 30 and the self-assembled molecular film 29 may occur via physical and/or chemical bonding.

Examples of physical bonding include, but are not limited to hydrogen bonding and van der Waals force. In a non-limitative embodiment using hydrogen bonding, at least one of the linking group (LG) 27 and the first connecting group (CG1) 32 includes either one of —NH, OH, and SH, or a functional group containing at least one of —NH, OH, and SH. The other of the linking group (LG) 27 and the first connecting group (CG1) 32 may be, but is not limited to, one of Cl, F, Br, I, —OH, —SH, —NH, —NHOH, —NHNH$_2$, ethers, thio-ethers, esters, thio-esters, ureas, carboxylic acids, amides, amines, ketones, aldehydes, nitrites, —NHCNH, a heterocyclic system containing at least one of the following hetero-atoms: N, O, and S, or mixtures thereof.

The bonding between the linking group (LG) 27 and the first connecting group (CG1) 32 via a van der Waals force may be established when both of the groups 27, 32 are hydrocarbons (either saturated or unsaturated), substituted hydrocarbons, ethers, thio-ethers, esters, thio-esters or a heterocyclic system containing at least one of the following hetero-atoms: N, O, and S.

It is to be understood that chemical bonding may be one of ionic bonding, covalent bonding and coordination bonding. Covalent bonding may be accomplished by one of oxidative cross-linking, heat- or photo-initiated cross-linking, substitution reaction, esterification and amide-formation. Examples of the bonds between the linking group (LG) 27 and the first connecting group (CG1) 32 include, but not limited to, one of the following: —S—S—, —CH$_2$CHR—CHR'CH$_2$, —C≡C—C≡C—, —CHR—O—CHR'—, —CHR—S—CHR'—, —CHR—NH—CHR'—, —CHR—NR''—CHR'—, and —COO—CHR—. Other suitable examples of the linking group (LG) 27 and the first connecting group (CG1) 32 include, but are not limited to —COOH, —OH, —SH, —NHR, —CHR—I, —CHR—Br, —CHR—Cl, —CHR—O—SO$_3$CF$_3$, —CHR—O—SO$_3$C$_6$H$_4$CH$_3$, —C≡C—H, or a vinyl group. It is to be understood that the R, R' and R'' may be any one of hydrogen, alkyls and aryl groups.

Ionic bonding between the linking group (LG) 27 and the first connecting group (CG1) 32 may be established by an acid-base reaction (ionization reaction). In this embodiment, one of the linking group (LG) 27 and the first connecting group (CG1) 32 is at least one of, for example, —CO$_2$H, —SO$_3$H, and —PO$_3$H; and the other of the linking group (LG) 27 and the first connecting group (CG1) 32 is an amine or an alkyl amine, for example.

FIG. 3E depicts the formed molecular layer 21 on the substrate 25. It is to be understood that the structure of the molecular layer 21 is such that the LB film covers the plurality of active device molecules 18 and the one or more defect site(s) 31. It is believed, without being bound to any theory, that the LB film 30 may be adapted to protect the plurality of active device molecules 18 and the at least one defect site 31 from potential problems (e.g. metal penetration, electrical shorting and chemical reaction) associated with the addition of a metal layer (e.g. top electrode 38 shown in FIG. 3G) or the surrounding environment.

Figure 3G:
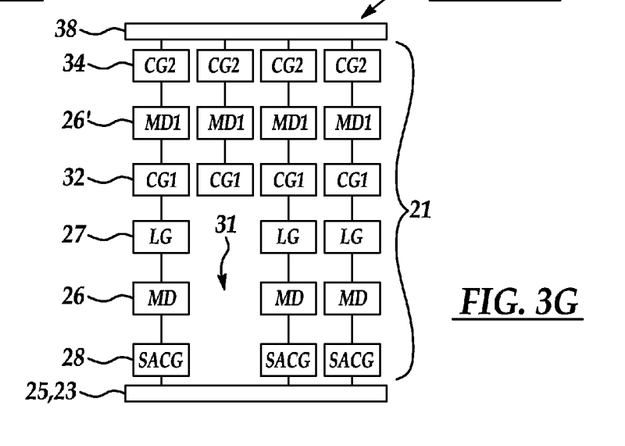

Referring now to FIG. 3G, an embodiment of the method may further include depositing a top electrode or substrate 38 on the LB film 30. In an embodiment, one of the first connecting group 32 or the second connecting group 34 is a connecting unit between the formed molecular layer 21 and the top electrode or substrate 38. It is to be understood that the substrate 38 may be either an electrode or a non-electrode, depending on the application. It is to be further understood that the substrate 38 may be hydrophilic or hydrophobic. As such, first connecting group 32 or second connecting group 34 will be more attracted to the substrate 38, depending upon the hydrophilicity/hydrophobicity of the substrate 38 and of the group 32, 34.

The top electrode or substrate 38 may be made of noble metals (e.g. Au, Pt, Ag, Cu, alloys of these metals, or the like). It is to be understood that any suitable deposition technique may be used, and in an embodiment, the top electrode or substrate 38 is deposited via an evaporative deposition method. Without being bound to any theory, it is believed that the substantially dense and uniform LB film 30 advantageously substantially prevents metal penetration during evaporative metal deposition when the top electrode or substrate 38 is formed and/or when subsequent metal diffusion occurs. The LB film 30 may also advantageously prevent a chemical reaction between the active device molecules 18 and the top electrode or substrate 38 or other environmental contaminants.

FIGS. 4A through 4H depict a similar embodiment of the method previously described in reference to FIGS. 3A through 3G, with an additional step therein. FIGS. 4A through 4F illustrate the formation of the molecular layer 21 by chemically bonding the active device molecules 18 to the surface of a substrate 25 to form the self-assembled molecular film 29, forming an LB film 30, and connecting (either directly or indirectly) the LB film 30 to the self-assembled molecular film 29.

Figures 4A, 4B:
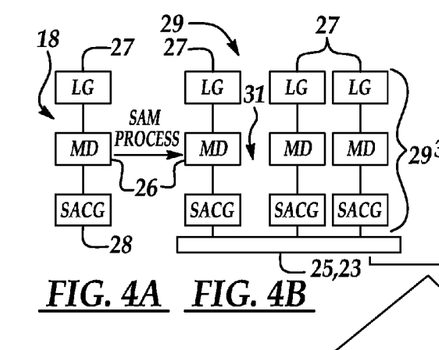
FIGS. 4A-4H is a schematic flow diagram depicting an alternate embodiment of a method of forming a molecular layer between two electrodes, including the deposition of a polymer film on the molecular layer.
Figure 4C:
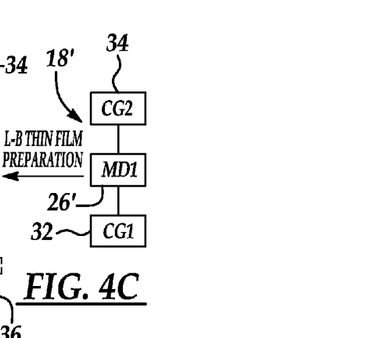
Figure 4D:
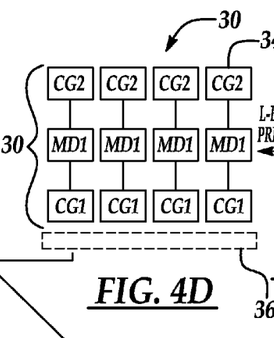
Figure 4E:
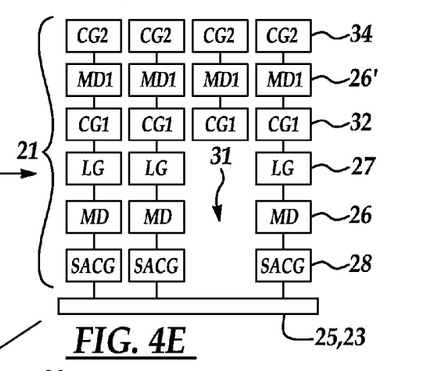
Figure 4F:
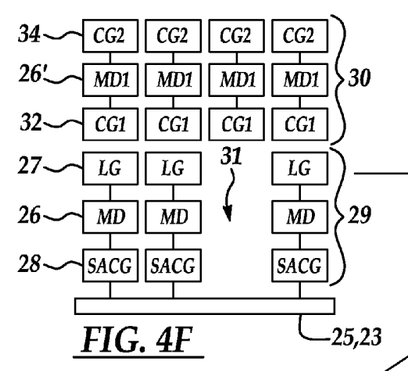
Figure 4G:
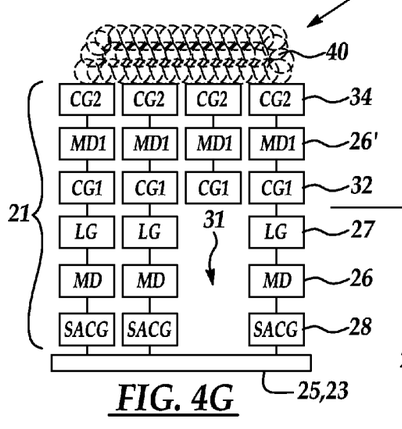

Referring now to FIG. 4G, the method optionally includes establishing a polymer film 40 on the LB film 30 of the molecular layer 21. The addition of the polymer film 40 may be desired or required because the top electrode or substrate 38 materials may react with and/or penetrate or diffuse through the LB film 30, even though the LB film 30 is substantially densely packed and uniform. It is believed, without being bound to any theory, that the polymer film 40 has molecules that are larger in size and may be cross-linked, thus acting as an effective barrier against reaction and/or penetration or diffusion. It is to be understood that the polymer film 40 may be designed to contain moieties that will react with the metal and form a protective layer of material, such as titanium nitride, titanium carbide, titanium oxide, aluminum oxide, aluminum nitride, aluminum carbide, or mixtures thereof, or the like, that will prevent further metal diffusion and act as a barrier to diffusion of oxygen and/or water.

It is desirable that a suitable polymer film 40 be compatible with (i.e. form a strong bonding interaction via ionic attractions, hydrogen bonding, van de Waals forces or explicit covalent chemical bonds formed between the LB film 30 and the polymer side groups) both the top electrode or substrate 38 that it will contact and the LB film 30 of the molecular layer 21. In an embodiment, the polymer film 40 may include conducting polymers. For example, the polymer film 40 may include, but is not limited to, doped polyanaline, undoped polyaniline, substituted polyaniline, doped polypyrrole, undoped polypyrrole, substituted polypyrrole, doped polythiophene, undoped polythiophene, substituted polythiophene, doped polyisothianaphthene, undoped polyisothianaphthene, substituted polyisothianaphthene, doped polyparaphenylene, undoped polyparaphenylene, substituted polyparaphenylene, doped polythienylene vinylene, undoped polythienylene vinylene, substituted polythienylene vinylene, doped polyparaphenylene vinylene, undoped polyparaphenylene vinylene, substituted polyparaphenylene vinylene, doped polyacetylene, undoped polyacetylene, substituted polyacetylene, or mixtures thereof. Examples of suitable dopants include, but are not limited to anilines, titanium chlorides, boron fluorides, boron chlorides, aluminum chlorides, ferric chlorides, iodine, sulfuric acids, or mixtures thereof.

Any suitable technique may be used to establish the polymer film 40. In an embodiment, the polymer film 40 is established by one of spin casting, evaporation and sublimation. To obtain the desired thickness of the polymer film 40 via spin casting, a low concentration of polymer may be dispersed in a solution having either a suitable solvent or a monomer of the polymer and a suitable initiating agent. This solution may then be spin cast followed by mild heat and/or vacuum treatment to substantially ensure even film formation.

Evaporative or sublimation techniques may require depositing a controlled amount of the polymer (a non-limitative example of which includes a short chain version of the polymer to ensure a sufficient vapor pressure) or monomer onto the surface of the top electrode or substrate 38 or onto the LB film 30. If desired, the polymer chain lengths may be increased by including an initiator, and cross-linking may be achieved with some type of cross linking agent. The polymer film 40 may then be subjected to heating or other curing processes that are compatible with the molecular layer 21.

Figure 4H:
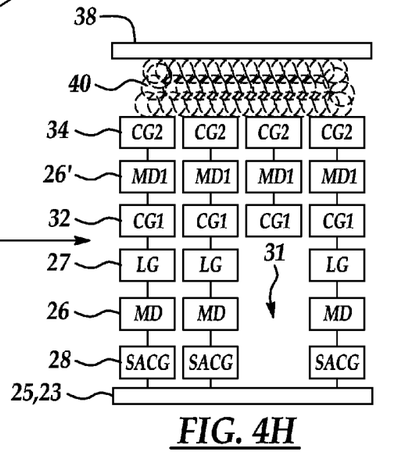

After establishing the polymer film 40, the top electrode or substrate 38 may then be deposited thereon, as depicted in FIG. 4H.

An embodiment of a crossed wire molecular device 24 includes a plurality of bottom electrodes 23, a plurality of top electrodes 38 crossing the bottom electrodes 23 at a non-zero angle, a self-assembled molecular film 29 formed from a plurality of active device molecules 18 bonded to the bottom electrode 23, and an LB film 30 bonded to the self-assembled molecular film 29. Each of the active device molecules 18 has a molecular switching moiety (MD) 26, and a linking group (LG) 27 and a self-assembling connecting group bonded to opposed ends of the moiety (MD) 26. The self-assembled molecular film 29 has one or more defect site(s) 31 therein. Further, the LB film 30 is bonded to the self-assembled molecular film 29 via at least some of the linking groups (LG) 27 such that the active device molecules 18 and the defect site(s) 31 are substantially covered. The films 29, 30 are operatively disposed in at least one junction formed where one electrode 23, 38 crosses another electrode 38, 23; and the LB film 30 is chemically bonded on a surface of one of the plurality of top electrodes 38.

A non-limitative embodiment of a method of forming the crossed wire molecular device 24 is as follows. The self-assembled molecular film 29 is chemically bonded to the surface of at least one of the plurality of bottom electrodes 23. An LB film 30 is formed and connected (via chemical and/or physical bonding) to at least some of the linking groups (LG) 27 of the active device molecules 18. The LB film 30 covers the plurality of active device molecules 18 and the one or more defect site(s) 31 to form the molecular layer 21. The method may further include forming one of the plurality of top electrodes 38, and crossing the one of the plurality of bottom electrodes 23 at the non-zero angle, thereby forming the junction there between. The molecular layer 21 is thereby operatively disposed at the junction.

An embodiment of a molecular switching device includes at least one bottom electrode 23 and at least one top electrode 38 crossing the bottom electrode 23 at a non-zero angle, thereby forming a junction there between. An embodiment of the molecular layer 21 (as described herein) may be operatively disposed in the junction.

While several embodiments have been described in detail, it will be apparent to those skilled in the art that the disclosed embodiments may be modified. Therefore, the foregoing description is to be considered exemplary rather than limiting.

What is claimed is:

1. A molecular layer, comprising:
    a Langmuir-Blodgett (LB) film of a molecule connected to a self-assembled molecular (SAM) film including a plurality of active device molecules, the molecule including a non-switching moiety having first and second connecting groups at opposed ends of the moiety, each of the plurality of active device molecules including:
        a switching moiety;
        a self-assembling connecting group at one end of the switching moiety; and
        a linking group at an opposed end of the switching moiety; and
    at least one defect site in the SAM film, the defect disposed between at least two of the plurality of active device molecules;
    wherein a respective number of the first connecting groups of the LB film are connected to at least some of the plurality of active device molecules via the linking groups;
    and wherein the LB film covers the plurality of active device molecules and the at least one defect site.

2. The molecular layer as defined in claim 1, further comprising a polymeric film established on the LB film.

3. The molecular layer as defined in claim 2 wherein the polymer film comprises at least one of doped polyanaline, undoped polyaniline, substituted polyaniline, doped polypyrrole, undoped polypyrrole, substituted polypyrrole, doped polythiophene, undoped polythiophene, substituted polythiophene, doped polyisothianaphthene, undoped polyisothianaphthene, substituted polyisothianaphthene, doped polyparaphenylene, undoped polyparaphenylene, substituted polyparaphenylene, doped polythienylene vinylene, undoped polythienylene vinylene, substituted polythienylene vinylene, doped polyparaphenylene vinylene, undoped polyparaphenylene vinylene, substituted polyparaphenylene vinylene, doped polyacetylene, undoped polyacetylene, substituted polyacetylene, and mixtures thereof.

4. The molecular layer as defined in claim 3 wherein the polymer film is doped with at least one of anilines, titanium chlorides, boron fluorides, boron chlorides, aluminum chlorides, ferric chlorides, iodine, sulfuric acids, and mixtures thereof.

5. The molecular layer as defined in claim 1 wherein the LB film is connected to the plurality of active device molecules via one of ionic bonding, covalent bonding, coordination bonding, hydrogen bonding and van der Waals force.

6. The molecular layer as defined in claim 1 wherein the linking group and the first and second connecting groups comprise at least one of multivalent hetero atoms selected from the group consisting of C, N, O, S, and P; functional groups containing the hetero atoms and selected from the group consisting of $NH_2$, NH-alkyl, NH-acyl, and NH-aryl; pyridine; substituted pyridines; heterocyclic compounds including at least one nitrogen atom; carboxylic acids; carboxylic esters; amides; nitriles; sulfuric acids; phosphoric acids; saturated hydrocarbons; unsaturated hydrocarbons; heterocyclic systems; amines; alkyl amines; and mixtures thereof.

7. The molecular layer as defined in claim 1 wherein the self-assembling connecting group comprises at least one of multivalent hetero atoms selected from the group consisting of C, N, O, S, and P; functional groups containing the hetero atoms and selected from the group consisting of SH, S-acyl, S—S-alkyl, OH, NH$_2$, NH-alkyl, NH-aryl, NH-acyl; heterocyclic compounds; pyridine; substituted pyridines; carboxylic acids; carboxylic esters; amides; nitriles; amines; alkyl amines; and mixtures thereof.

8. The molecular layer as defined in claim 1 wherein the switching moiety of the plurality of active device molecules is at least one of an optically switchable molecular functional unit and an electrically switchable molecular functional unit.

9. The molecular layer as defined in claim 8 wherein the switching moiety comprises at least one of saturated hydrocarbons, unsaturated hydrocarbons, substituted hydrocarbons, heterocyclic systems, organometallic complex systems, and mixtures thereof.

10. A molecular switching device, comprising:
   at least one bottom electrode;
   at least one top electrode, the top electrode crossing the bottom electrode at a non-zero angle, thereby forming a junction; and
   a molecular layer operatively disposed in the junction, the molecular layer including:
      a plurality of active device molecules each having a switching moiety, a self-assembling connecting group at one end of the moiety and a linking group at an opposed end of the moiety;
      at least one defect site between the plurality of active device molecules; and
      a Langmuir-Blodgett (LB) film of a molecule connected to at least some of the linking groups, the molecule including a non-switching moiety having first and second connecting groups at opposed ends of the moiety, wherein a respective number of the first connecting groups of the LB film are connected to the plurality of active device molecules via the at least some of the linking groups, and wherein the LB film covers the plurality of active device molecules and the at least one defect site.

11. The molecular switching device as defined in claim 10, further comprising a polymeric film established on the LB film.

12. The molecular switching device as defined in claim 11 wherein the polymer film comprises at least one of doped polyanaline, undoped polyaniline, substituted polyaniline, doped polypyrrole, undoped polypyrrole, substituted polypyrrole, doped polythiophene, undoped polythiophene, substituted polythiophene, doped polyisothianaphthene, undoped polyisothianaphthene, substituted polyisothianaphthene, doped polyparaphenylene, undoped polyparaphenylene, substituted polyparaphenylene, doped polythienylene vinylene, undoped polythienylene vinylene, substituted polythienylene vinylene, doped polyparaphenylene vinylene, undoped polyparaphenylene vinylene, substituted polyparaphenylene vinylene, doped polyacetylene, undoped polyacetylene, substituted polyacetylene, and mixtures thereof.

13. The molecular switching device as defined in claim 12 wherein the polymer film is doped with at least one of anilines, titanium chlorides, boron fluorides, boron chlorides, aluminum chlorides, ferric chlorides, iodine, sulfuric acids, and mixtures thereof.

14. The molecular switching device as defined in claim 10 wherein the LB film is connected to the plurality of active device molecules via one of ionic bonding, covalent bonding, coordination bonding, hydrogen bonding and van der Waals force.

15. The molecular switching device as defined in claim 10 wherein the linking group and the first and second connecting groups comprise at least one of multivalent hetero atoms selected from the group consisting of C, N, O, S, and P; functional groups containing the hetero atoms and selected from the group consisting of NH$_2$, NH-alkyl, NH-acyl, and NH-aryl; pyridine; substituted pyridines; heterocyclic compounds including at least one nitrogen atom; carboxylic acids; carboxylic esters; amides; nitriles; sulfuric acids; phosphoric acids; saturated hydrocarbons; unsaturated hydrocarbons; heterocyclic systems; amines; alkyl amines; and mixtures thereof.

16. The molecular switching device as defined in claim 10 wherein the self-assembling connecting group comprises at least one of multivalent hetero atoms selected from the group consisting of C, N, O, S, and P; functional groups containing the hetero atoms and selected from the group consisting of SH, S-acyl, S—S-alkyl, OH, NH$_2$, NH-alkyl, NH-aryl, NH-acyl; heterocyclic compounds; pyridine; substituted pyridines; carboxylic acids; carboxylic esters; amides; nitriles; amines; alkyl amines; and mixtures thereof.

17. The molecular switching device as defined in claim 10 wherein the switching moiety is at least one of an optically switchable molecular functional unit and an electrically switchable molecular functional unit.

18. The molecular switching device as defined in claim 17 wherein the switching moiety includes at least one of saturated hydrocarbons, unsaturated hydrocarbons, substituted hydrocarbons, heterocyclic systems, organometallic complex systems, and mixtures thereof.

19. A molecular layer, comprising:
   a self-assembled molecular (SAM) film including a plurality of active device molecules, each of which includes:
      a switching moiety;
      a self-assembling connecting group at one end of the switching moiety, the self assembling connecting group being selected from SH, S-acyl, S—S-alkyl, and OH; and
      a linking group at an opposed end of the switching moiety;
   at least one defect site in the SAM film, the defect disposed between at least two of the plurality of active device molecules; and
   a Langmuir-Blodgett (LB) film of a molecule connected to the SAM film, the molecule including a molecular switching moiety having first and second connecting groups at opposed ends of the moiety, the first and second connecting groups being selected from multivalent hetero atoms selected from the group consisting of C, N, O, S, and P; functional groups containing the hetero atoms and selected from the group consisting of NH$_2$, NH-alkyl, NH-acyl, and NH-aryl; pyridine; substituted pyridines; heterocyclic compounds including at least one nitrogen atom; carboxylic acids; carboxylic esters; amides; nitriles; sulfuric acids; phosphoric acids; saturated hydrocarbons; unsaturated hydrocarbons; heterocyclic systems; amines; alkyl amines; and mixtures thereof;
   wherein a respective number of the first connecting groups of the LB film are connected to at least some of the plurality of active device molecules via the linking groups;
   and wherein the LB film covers the plurality of active device molecules and the at least one defect site.

20. The molecular layer as defined in claim 19 wherein the switching moiety and the molecular switching moiety having first and second connecting groups at opposed ends are each at least one of an optically switchable molecular functional unit and an electrically switchable molecular functional unit.

* * * * *

UNITED STATES PATENT AND TRADEMARK OFFICE
CERTIFICATE OF CORRECTION

| | | |
|---|---|---|
| PATENT NO. | : 7,875,348 B2 | Page 1 of 1 |
| APPLICATION NO. | : 11/773090 | |
| DATED | : January 25, 2011 | |
| INVENTOR(S) | : Sean X. Zhang et al. | |

It is certified that error appears in the above-identified patent and that said Letters Patent is hereby corrected as shown below:

In column 10, line 33, in Claim 3, delete "polyanaline," and insert -- polyaniline, --, therefor.

In column 11, line 42, in Claim 12, delete "polyanaline," and insert -- polyaniline, --, therefor.

Signed and Sealed this
Twenty-first Day of June, 2011

David J. Kappos
*Director of the United States Patent and Trademark Office*